United States Patent [19]
Condie

[11] Patent Number: 5,236,094
[45] Date of Patent: Aug. 17, 1993

[54] WIRING PANEL RACK APPARATUS

[76] Inventor: Rex S. Condie, 945 Castillo Dr. South, Maricopa County, Litchfield Park, Ariz. 85340

[21] Appl. No.: 695,730

[22] Filed: May 6, 1991

[51] Int. Cl.⁵ .............................................. A47G 19/08
[52] U.S. Cl. .......................................... 211/41; 211/4; 211/26; 206/334
[58] Field of Search .................... 211/41, 181, 184, 26, 211/40, 89, 4; 361/415; 206/334

[56] References Cited

U.S. PATENT DOCUMENTS

| | | | |
|---|---|---|---|
| 1,402,332 | 1/1922 | Wiehl | 211/40 |
| 2,917,179 | 12/1959 | Casey et al. | 211/40 |
| 4,434,899 | 3/1984 | Rivkin | 211/41 |
| 4,489,835 | 12/1984 | Tombal et al. | 211/41 |
| 4,588,086 | 5/1986 | Coe | 206/334 X |
| 4,593,813 | 6/1986 | Powel | 206/334 X |
| 4,600,231 | 7/1986 | Sickles | 211/41 X |
| 4,762,689 | 8/1988 | Frey et al. | 211/41 X |
| 5,086,920 | 2/1992 | Binienda | 211/41 X |

*Primary Examiner*—Blair M. Johnson
*Attorney, Agent, or Firm*—H. Gordon Shields

[57] ABSTRACT

Printed circuit board or wiring panel apparatus includes a generally rectangular outer frame and a plurality of holding and receiving elements for holding and receiving the printed circuit boards or wiring panels. The holding and receiving elements include embodiments in which the side elements are permanently or pivotally secured to the sides of the rack frame and support elements secured to the bottom of the rack frame. One type of side receiving and holding elements may be curved and are generally parallel to each other for holding the boards or panels in a curved configuration during processing and transporting. Another type of holding and receiving elements may be pivotally connected for imposing a reverse curve in boards or panels. The rack apparatus may include frame elements which allow the frame to vary in size vertically and horizontally to accommodate different sized panels or boards.

18 Claims, 5 Drawing Sheets

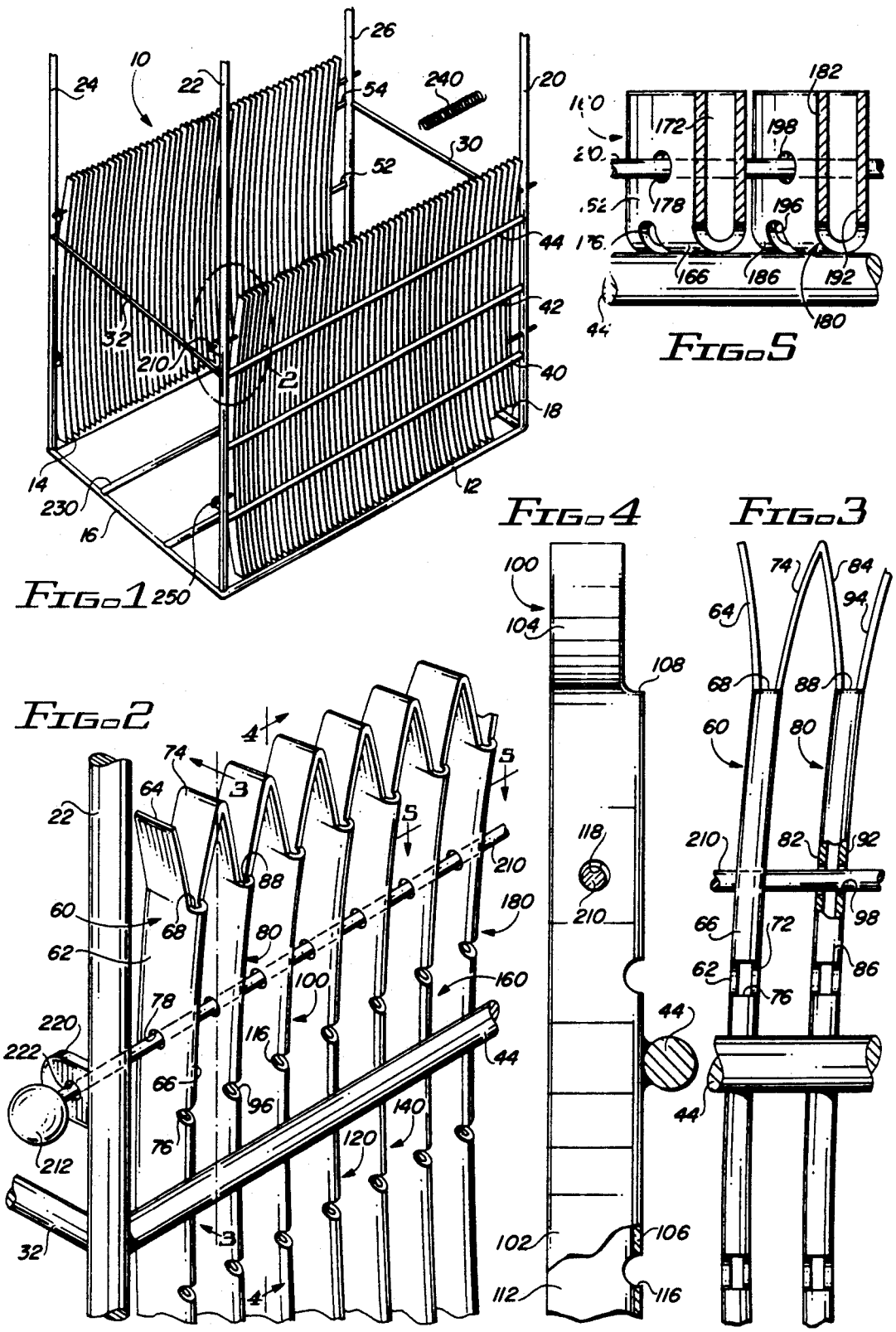

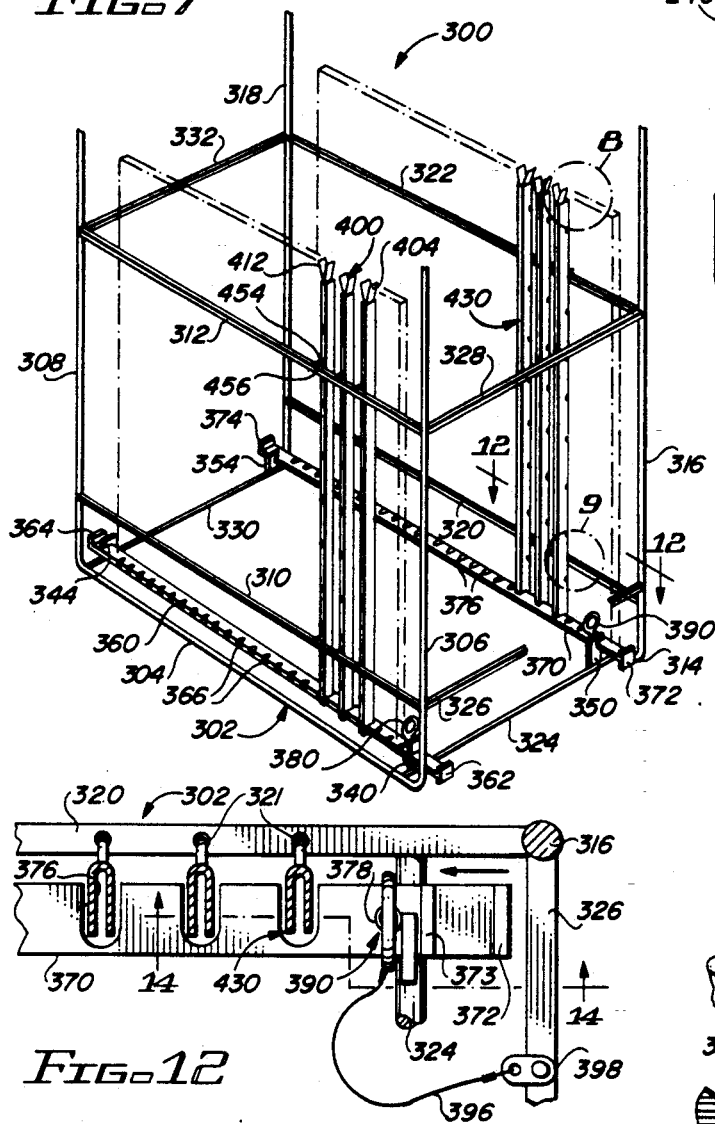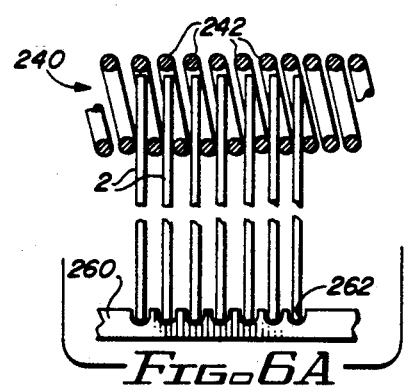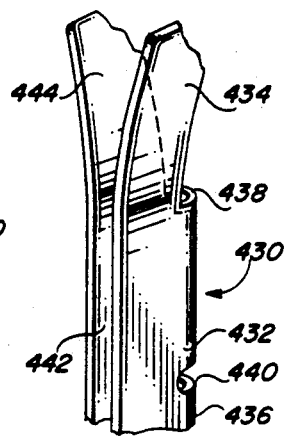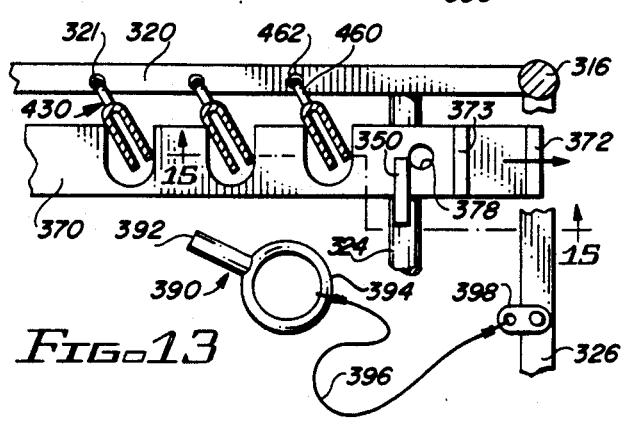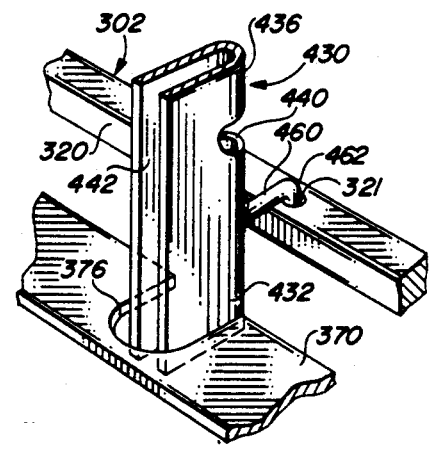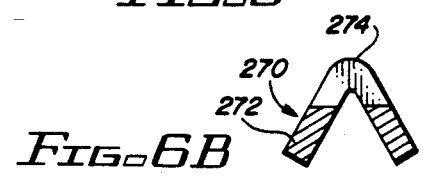

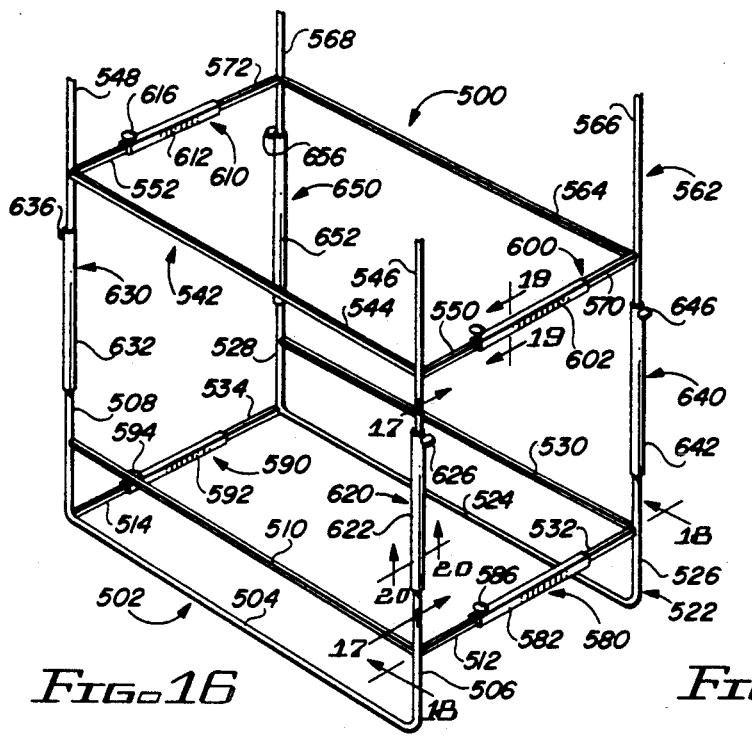
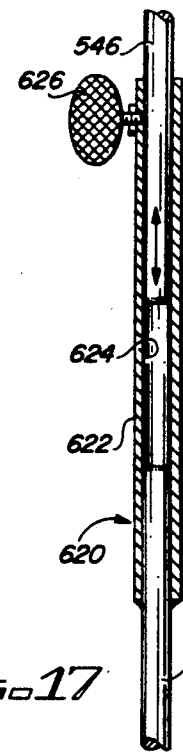
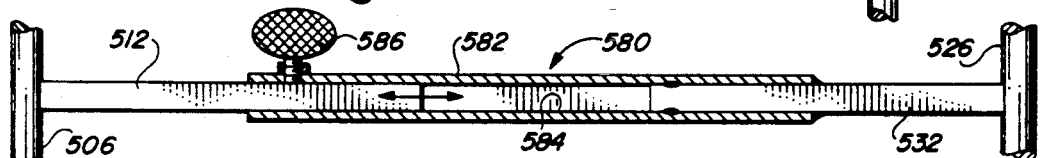
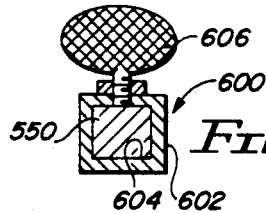
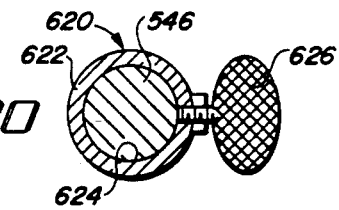
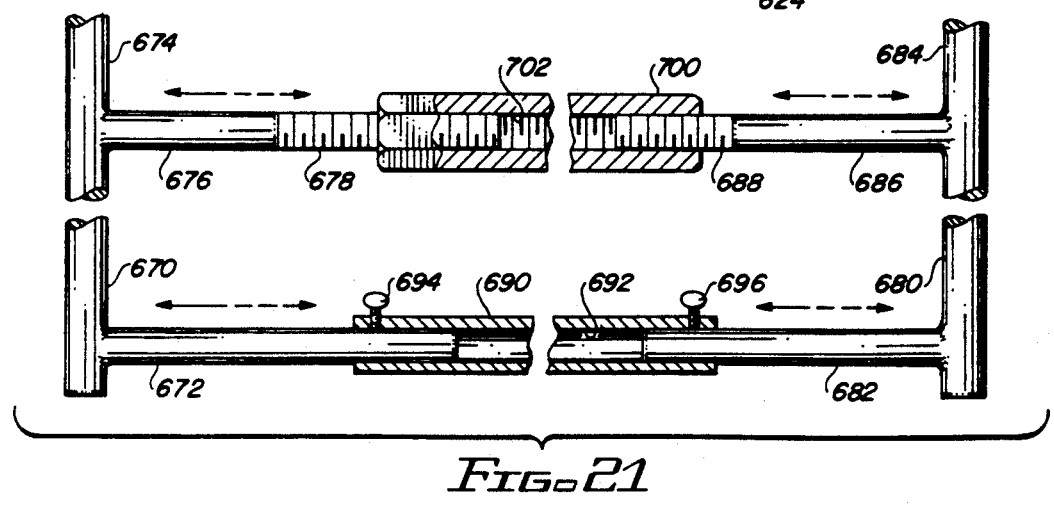

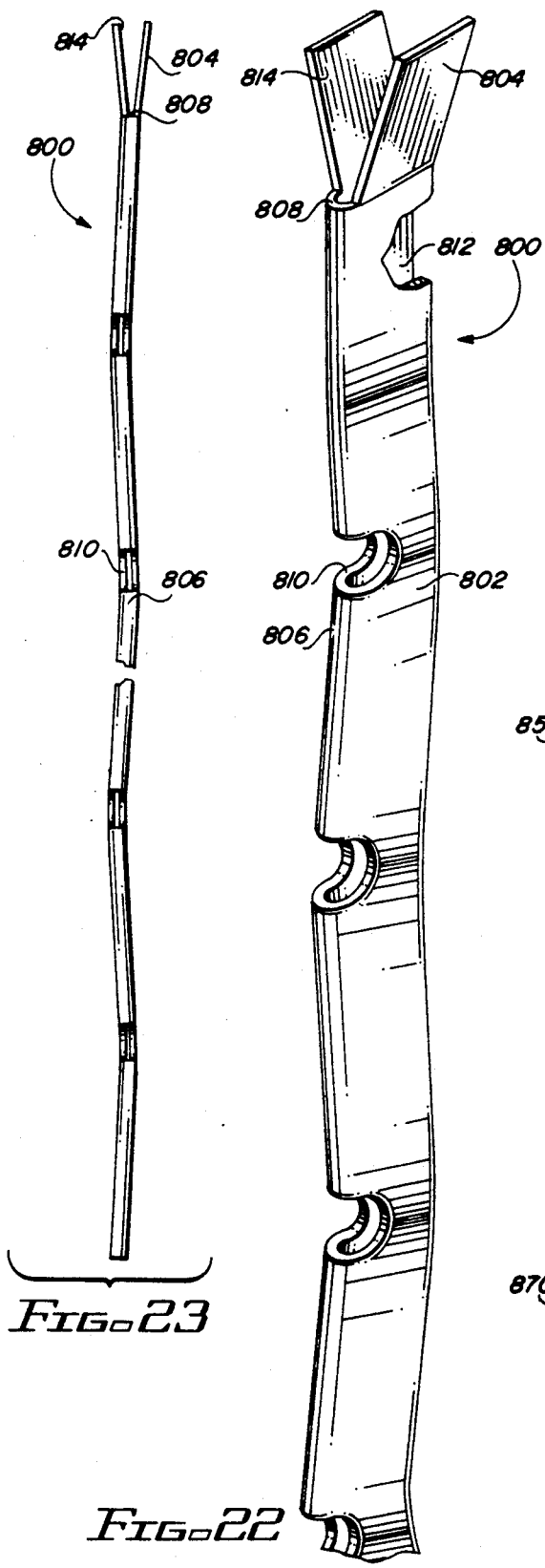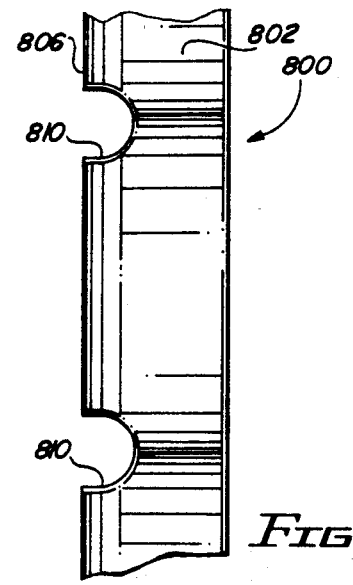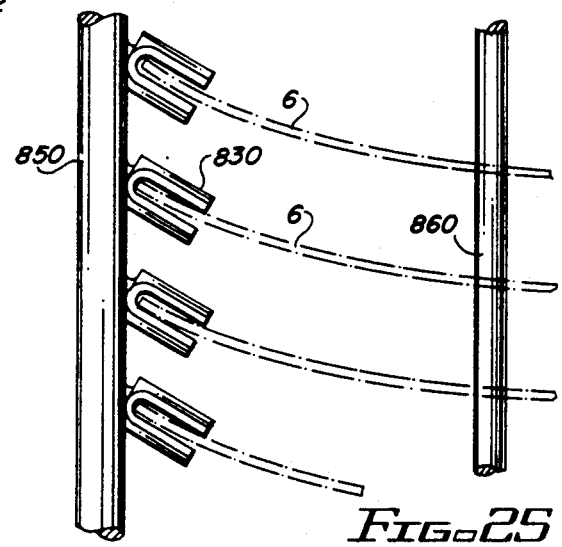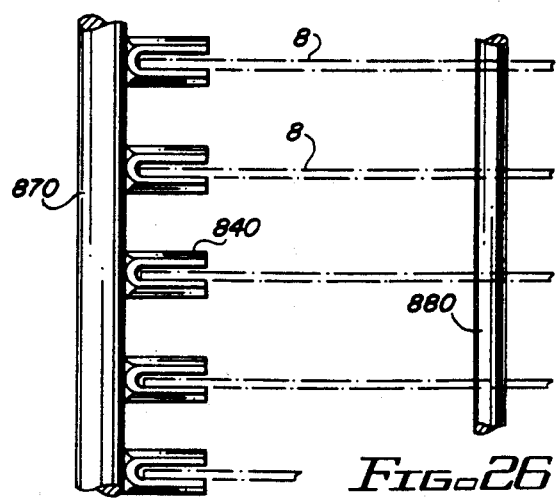

WIRING PANEL RACK APPARATUS

BACKGROUND OF THE INVENTION

1. Field of Invention

This invention relates to rack apparatus and, more particularly, to rack apparatus for wiring panels or printed circuit boards.

2. Description of the Prior Art

The terms "printed circuit boards" and "wiring panels" are substantially synonymous in meaning. The term "printed circuit board" is an older term, while the term "wiring panel" is a newer more contemporary, term. In the following specification, both terms may be used interchangeably.

In the fabrication of wiring panels or printed circuit boards, there may be a plurality of discrete panels or boards fabricated on a relatively large, composite circuit board blank. For example, a printed circuit board blank, having dimensions roughly 24 inches by 24 inches (70 cm ×70 cm), may include four discrete printed circuit boards. After the completed processing of the composite board, the composite board will be cut into the four discrete printed circuit boards, each of which is roughly ¼ the size of the entire, single, composite board.

Moreover, some printed circuit boards are relatively large even though they may include only a single circuit layout, rather than a plurality of discrete circuits.

The relatively large circuit boards provide some inherent problems in their processing that are not present in the processing of smaller boards. The lack of stiffness of the large printed circuit boards is the primary problem. The rack apparatus of the present invention overcomes the lack of stiffness problem.

In the processing of these relatively large printed circuit boards, the substrate board, with its etched circuits thereon, goes through different enchant baths and rinse baths. A plurality of the circuit boards is disposed in a single rack, and the rack is in turn handled by appropriate materials handling equipment for conveying, dipping, and lifting. Each rack is typically made of stainless steel so that it will not react with the acid baths, etc., into which the circuit boards are dipped during the processing stages or steps.

Each large printed circuit board is relatively flexible, and if adjacent boards contact each other, there may be, and usually are, resulting defects in the boards. Accordingly, it is necessary that the boards not contact each other and that they remain spaced apart from each other all during the processing steps.

In the prior art, the circuit board elements typically are held upright in a wire rack, and the likelihood of the adjacent boards touching or contacting each other or contacting the wire rack is relatively great. There is a reject rate of the boards that may be as high as 25 or 30 percent due to the touching or contacting problem.

The apparatus of the present invention prevents the contact between adjacent boards and substantially eliminates any part of the rack from being in the circuit board area by providing a curved rack, or curved guides in a rack, so that the printed circuit boards are arcuately curved during the processing. The arcuate curve in each board provides sufficient stiffening of the boards to prevent the undesirable contact between the adjacent boards during processing, transporting, etc. The boards contact the rack apparatus only at the outer periphery of the boards, where there are no circuit elements.

In addition to appropriately supporting the large circuit boards, the rack apparatus of the present invention includes sufficient open space to provide for the quick drain of the liquid materials into which the racks are lowered for the processing. This provides a minimal drag-out of the liquids. Obviously, the drag-out of the material is undesirable for several reasons. Among the reasons are the loss of the acid or other processing material and the dilution of the rinse material.

SUMMARY OF THE INVENTION

The invention described and claimed herein comprises rack apparatus for supporting and holding a plurality of relatively large printed circuit boards in a generally parallel fashion and with a "C" general configuration to prevent the flexing of the circuit boards during the processing of the boards and the transporting of the boards between the processing stations or steps.

The rack apparatus of the present invention is preferably made of stainless steel, and includes sufficient open areas to allow for the quick draining of the liquid material into which the rack apparatus, with the circuit boards therein, is placed during processing. Additional elements are used to help hold the circuit boards in place, such as rods extending through aligned holes in the perimeter or periphery of the circuit boards and the rack apparatus, and a helical coil which may be placed on the top of the circuit boards at the upper portion of the rack apparatus to maintain the appropriate spacing of the tops of the circuit boards in the rack apparatus.

Among the objects of the present invention are the following:

To provide new and useful rack apparatus for holding a plurality of printed circuit boards;

To provide new and useful circuit board rack apparatus in which a plurality of printed circuit boards may be disposed during the processing of the circuit boards;

To provide new and useful rack apparatus holding a plurality of wiring panels in a generally curved configuration;

To provide new and useful rack apparatus for holding a plurality of circuit boards in a spaced apart and curved relationship;

To provide new and useful rack apparatus for holding a plurality of wiring panels at the outer periphery of the panels and for maintaining the panels in the rack apparatus by utilizing rods extending through aligned apertures in the periphery of the panels;

To provide new and useful rack apparatus having receiving and holding elements for holding printed circuit boards in a generally "C" curved configuration;

To provide new and useful rack apparatus having pivoting receiving and holding elements;

To provide new and useful rack apparatus for holding a plurality of printed circuit boards in a spaced apart relationship and for utilizing a helical coil at the top of the printed circuit boards to maintain a spaced apart relationship of the printed circuit boards; and To provide new and useful rack apparatus for supporting a plurality of circuit boards during the processing of the circuit boards and for maintaining the circuit boards in a spaced apart relationship to prevent contact between adjacent circuit boards and rack parts during transporting and processing.

BRIEF DESCRIPTION OF THE DRAWING

FIG. 1 is a perspective view of rack apparatus of the present invention.

FIG. 2 is an enlarged view of a portion of the apparatus of FIG. 1 taken generally from oval 2 of FIG. 1.

FIG. 3 an enlarged view in partial section taken generally along line 3—3 of FIG. 2.

FIG. 4 is an enlarged view in partial section taken generally along line 4—4 of FIG. 2.

FIG. 5 is an enlarged view in partial section taken generally along line 5—5 of FIG. 2.

FIG. 6A is a view in partial section of a portion of the apparatus of the present invention.

FIG. 6B is a view in partial section of an alternate embodiment of a portion of the apparatus of FIG. 6A.

FIG. 7 is a perspective view of an alternate embodiment of the apparatus of the present invention.

FIG. 8 is an enlarged perspective view of a portion of the apparatus of FIG. 7 taken generally from circle 8 of FIG. 7.

FIG. 9 is an enlarged perspective view of a portion of the apparatus of FIG. 7 taken generally from circle 9 of FIG. 7.

FIG. 12 is a view in partial section taken generally along line 12—12 of FIG. 7.

FIG. 13 is a view in partial section of the apparatus of FIG. 12 sequentially following the apparatus illustrated in FIG. 12.

FIG. 16 is a perspective view of another alternate embodiment of the apparatus of the present invention.

FIG. 17 is a view in partial section taken generally along line 17—17 of FIG. 16.

FIG. 18 is a view in partial section taken generally along line 18—18 of FIG. 16.

FIG. 19 is a view in partial section taken generally along line 19—19 of FIG. 16.

FIG. 20 is a view in partial section taken generally along line 20—20 of FIG. 16.

FIG. 21 is a front view in partial section illustrating different elements usable with the apparatus of the FIG. 16.

FIG. 22 is a perspective view of a portion of an alternate embodiment of a portion of the apparatus of the present invention.

FIG. 23 is a front view of the apparatus of FIG. 22.

FIG. 24 is a side view of a portion of the apparatus of FIG. 22.

FIG. 25 is a top view illustrating the use environment of the apparatus of FIGS. 22, 23, and 24.

FIG. 26 is a top view illustrating an alternate use environment of the apparatus of FIGS. 22, 23, and 24.

DESCRIPTION OF THE PREFERRED EMBODIMENT

Figure 10:
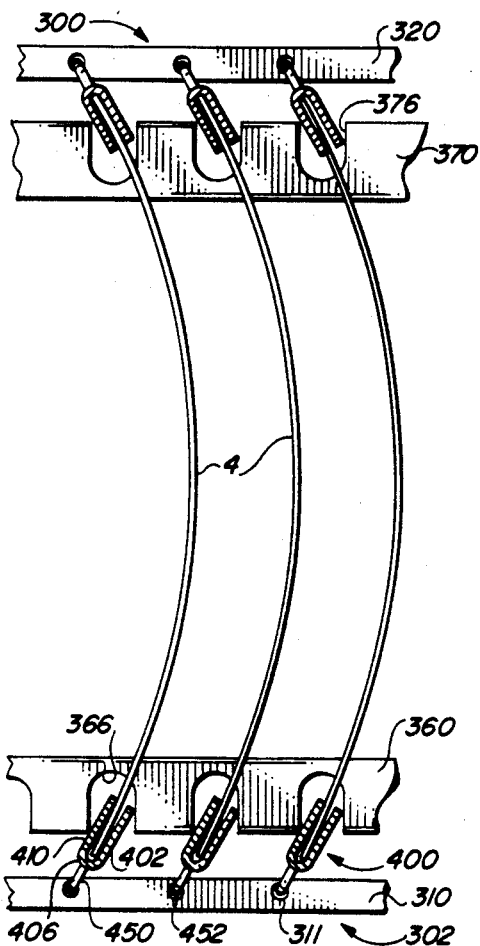
FIG. 10 is a top view of a portion of the apparatus of FIG. 7 illustrating the operation of the apparatus.

FIG. 1 is a perspective view of printed circuit board rack apparatus 10 of the present invention. The rack apparatus 10 includes four base elements, including a side base element 12, a side base element 14 which is generally parallel to and spaced apart from the base element 12, and a pair of connecting base elements, including a rear base element 16 and a front base element 18. The four base elements 12, 14, 16, and 18 define a rectangle. The terms "front" and "rear" refer to the orientation of the rack apparatus 10 with respect to the loading and unloading of the printed circuit boards. This will be discussed in detail below. The elements 16 and 18 are transversely extending on cross frame elements.

Extending upwardly from, and appropriately secured to, the base elements are four vertical elements. The vertical elements include a vertical element 20, a vertical element 22, a vertical element 24, and a vertical element 26. The vertical elements 20 . . . 26 extend upwardly from the corners of the rack apparatus, or from the juncture of adjacent base elements.

For stiffening and for support purposes, there are cross elements secured to the vertical elements. A front cross element 30 extends between the front vertical elements 20 and 26, and a rear cross element 32 extends between the rear vertical elements 22 and 24.

There are three left side elements which support the printed circuit board receiving and holding elements. The side elements include, for the left side of the rack apparatus 10, a lower side element 40, a middle side element 42, and upper side element 44. The elements 40, 42, and 44 extend between and are appropriately secured to the front vertical element 20 and the rear vertical element 22.

Similarly, there are three right side elements which are secured to and extend between the vertical elements 24 and 26. Two of the side elements may be seen in FIG. 1. They include a middle side element 52 and a upper side element 54.

A plurality of curved receiving and holding elements for the printed circuit boards are secured to the side elements. The holding and receiving elements are paired in that they are disposed in pairs opposite to and aligned with one another. Each pair is appropriately aligned parallel to each other to receive a single circuit board. The left side receiving and holding elements are secured to the side elements 40, 42, and 44, and the right side parallel elements are secured to the right side elements, of which only the elements 52 and 54 are shown in FIG. 1.

Details of the holding and receiving elements are illustrated in FIGS. 2, 3, 4, and 5. FIG. 2 is an enlarged perspective view of a portion of the rack apparatus 10 taken generally from Oval 2 of FIG. 1. In FIG. 2, a portion of the vertical element 22 is shown, along with a portion of the side element 44 and a portion of the rear cross element 32. Seven receiving and holding elements are illustrated in FIG. 2. The seven circuit board receiving and holding elements include an element 60, an element 80, an element 100, an element 120, an element 140, an element 160, and an element 180. Details of the various elements, all of which are substantially identical to each other, are shown in FIG. 2, and also in FIGS. 3, 4, and 5.

FIG. 3 is a view partial section taken generally along line 3—3 of FIG. 2, showing details of holding elements 60 and 80. FIG. 4 is a view in partial section taken generally along line 4—4 of FIG. 2, showing details of receiving and holding element 100. FIG. 5 is a view in partial section through a portion of the elements 160 and 180 taken generally along line 5—5 of FIG. 2. Reference will be made to the specific figures in the following discussion.

In FIGS. 2 and 3, details of the receiving and holding elements 60 and 80 are illustrated. The receiving and holding element 60 includes two spaced apart and generally vertically extending arms, including an arm 62 and an arm 72. The arms are connected together by a curved end or connector web 66. The connector web 66 terminates at a top 68. Extending upwardly above the top 68, and curving arcuately outwardly, are two guide tabs. The guide tabs extend upwardly and curve outwardly from the arms. The arm 62 includes a guide tab 64, and the arm 72 includes a guide tab 74.

A plurality of drain slots 76 extend through the end or connector web 66 and adjacent portions of the arms 62 and 72 in a vertically spaced apart relationship. The purpose of the drain slots is to help the liquid into which the rack apparatus, with the circuit boards disposed in the receiving and holding elements, drain from the rack and from the circuit boards as the rack apparatus 10 is raised upwardly and moved outwardly from the various baths.

The cross sectional configuration of a receiving and holding element is of a generally U-shape, defining an elongated and curved slot from top to bottom, or along the vertical axes of the receiving and holding element. The arms are spaced apart to receive a printed circuit board. The outwardly flaring configuration of the guide tabs at the top of the arms help to guide the printed circuit boards into the elongated slot of the receiving and holding elements.

The receiving and holding elements are, of course, as indicated above, appropriately secured, as by welding, to the side members. The side member 44 is illustrated in FIGS. 2, 3, 4, and 5. As best shown in FIG. 4, the receiving and holding element 100 is secured, as by welding, to the side member 44.

The receiving and holding element 80 is substantially identical to the receiving and holding element 60. The receiving and hold element 80 includes a pair of arms 82 and 92, with a connector web or end 86 defining the outer end of the element 80. There is a top 88 on the end 86, and a pair of guide tabs 84 and 94 extend upwardly from the top 88. The guide tab 84 extends upwardly from the arm 82, and the guide tab 94 extend upwardly from the arm 92.

The guide tabs 74 and 84 are appropriately secured together at their top or distal ends. They are appropriately secured together, as by welding. The adjacent guide tabs on all of the receiving and holding elements are secured together. Only the outer tabs of the first and last elements are not secured together because there is no adjacent tab. For example, as shown in FIGS. 2 and 3, the guide tab 64 does not have an adjacent guide tab to secure it to. However, as best shown in FIG. 2, the other guide tabs of the elements 60, 80, 100, 120, 140, 160, and 180, and all of the rest of them all have their guide tabs secured together. Again, however, the receiving and holding element at the opposite ends of the rack apparatus from the holding and receiving element 60 similarly has one guide tab which is not secured to an adjacent tab.

The receiving and holding element 80 includes a plurality of drain slots 96 extending through the end or connector web 86 and into adjacent portions of the arms. The drain slots 96 are all spaced apart periodically along the vertical length of the receiving and holding elements, as shown in FIGS. 2, 3, and 4.

The arcuate or curved nature of the holding and receiving elements may be seen in FIG. 1 and in FIG. 3. The curvature of the receiving and holding elements comprises a gentle "C" curve extending vertically between the top and bottom of the elements. The curves are generally parallel to each other in all of the receiving and holding elements. That is the receiving and holding elements are generally parallel to each other.

As the printed circuit boards are disposed into the holding and receiving elements, they will inherently, or necessarily, assume the "C" curvature throughout their vertical height. The curvature is sufficient to provide a stiffness in the circuit boards to help them maintain their spaced apart relationship as they move downwardly into a bath and are moved upwardly out of the bath.

For securing the printed circuit boards in the rack apparatus 10, and specifically in the receiving and holding elements, lock rods may be used. A lock rod 210 is shown in FIGS. 2, 3, 4, and 5. To accommodate the lock rod 210, aligned apertures extend through the arms of the receiving and holding elements and also through the outer periphery of the printed circuit board portions which are disposed in the receiving and holding elements.

In FIG. 3, the lock rod 210 is shown extending through a pair of aligned apertures 98 in the receiving and holding element 80.

In FIG. 5, the lock rod 210 is shown extending through an aligned pair of apertures 178 in a receiving and holding element 160, and in an aligned pair of apertures 198 in a receiving and holding element 180. The receiving and holding element 160 includes a pair of arms 162 and 172 and a connecting web 166. The aligned apertures 178 extend through the arms 162 and 172. A drain slot 176 is shown extending through the end 166 and through adjacent portions of the arms 162 and 172.

Adjacent to the receiving and holding element 160 is the receiving and holding element 180. The receiving and holding element 180 includes a pair of arms 182 and 192, and they are secured together by an end or connector web 186. A drain slot 196 is shown in FIG. 5 extending through the end 186 and through adjacent portions of the arms 182 and 192. The pair of aligned apertures 198 is shown extending through the arms 182 and 192.

In FIG. 4, the receiving and holding element 100 is illustrated. The receiving and holding element 100 is shown in a side view in partial section. The receiving and holding element 100 includes a pair of arms 102 and 112. A connector web or end 106 extends between the arms 102 and 112. The connector web 106 terminates in a top 108, and a guide tab 104 extends upwardly from the arm 102 above the top 108. Two drain slots 116 extend through the end 106 and through the adjacent portion of the arms 102 and 112. As indicated above, the receiving and holding element 100 is appropriately secured, as by welding, to the side structural element 44.

An aligned aperture pair 118 extends through the arms 102 and 112. The lock rod 210 is shown extending through the aligned apertures 118.

Returning again to FIG. 2, the lock rod 210 includes a knob 212 on one end. The purpose of the knob 212 is, of course, to help in the insertion and removal of the lock rod 210.

Extending outwardly from the vertical frame member 22 is a tab 220. The tab 220 includes a aperture 222 extending through it. The lock rod 210 extends through the aperture 222 in the tab 220. The aperture 222 is appropriately aligned with the various aperture pairs, discussed above, in the receiving and holding elements.

If desired, there may be a second lock rod extending through the receiving and holding elements. A second lock rod 250 is shown below the lock rod 210 in FIG. 1. In FIG. 1 the lock rod 250 extends through an inwardly extending tab secured to the vertical element 22, generally parallel to the tab 220.

There is a guide tab, not shown, extending inwardly from the vertical element or member 20 generally parallel to the tab 220 for the lock rod 210. There is also a pair of guide tabs for the lock rod 250. One tab is on the vertical element or member 20 and the other is on the vertical element or member 22. Neither tabs are shown in the drawing. There may be additional lock rods extending through the receiving and holding elements secured to the opposite side of the rack apparatus 10 from the receiving and holding elements illustrated in detail in FIGS. 2, 3, 4, and 5. There will likewise be tabs extending inwardly from the vertical members 24 and 26, in generally a manner similar to the tab 220 illustrated in FIG. 2, for the lock rods on the right side of the rack apparatus 10.

At the bottom of the rack apparatus 10, and extending between the lower portions of the receiving elements, there may be a plurality of bottom longitudinally extending holding and receiving elements 230. The bottom receiving and holding elements receive the bottom or lower portions of the printed circuit boards and accordingly support the printed circuit boards in the apparatus 10.

The bottom support elements or members are appropriately secured to the bottom elements 16 and 18. The bottom support for the boards or panels may simply be one or more longitudinally extending rods notched to receive the boards or panels. This will be discussed in more detail below in conjunction with FIG. 6A and FIG. 6B.

A helical coil 240 is shown in FIG. 1 and in FIG. 6A. FIG. 6A is a view in partial section of the coil 240, showing a plurality of printed circuit boards on wiring panels 2 secured to the coil 240. When the printed circuit boards are loaded into the receiving and holding elements of the rack apparatus 10, they are secured to the "solid" rack elements on their sides and bottoms. However, they are not secured on their tops. The "C" configuration of the panels or boards provides inherent stiffening, but it may still be advantageous to maintain the relative spacing of the boards at their tops. This is accomplished by the helical coil 240.

The coil 240 comprises a plurality of discrete coil elements 242. The coil 240 is placed onto the tops of the boards and the coil elements 242 hold the boards in a spaced apart relationship. The coil elements 242 are disposed adjacent to each other, such as in a tension spring. That is, the helical coil 240 is preferably a tension spring so as to provide an inherent inward bias for each coil element. Accordingly, the coil elements tend to grip each board or panel in accordance with the spring tension of each coil.

In FIG. 6A, a panel or board 2 is shown disposed between each coil element. Obviously, there could be more than one coil element between adjacent boards or panels. The actual spacing may depend on the size of the element 240, the spacing between adjacent receiving and holding elements, etc.

A bottom support bar or rod 260 is also shown in FIG. 6A. The bar or rod 260 may extend between and be appropriately secured to the elements 16 and 18 (see FIG. 1). The rod 260 includes a plurality of spaced apart notches 262 which receive the bottoms of the boards or panels 2.

The use of a bottom support rod 260 over a U-shaped element, such as the holding and receiving elements disposed horizontally has several obvious advantages. The first advantage is cost. A rod is less expensive to notch than a support element is to fabricate. The second advantage is a substantial decrease in drag-out. There is less area for a liquid to accumulate in a notched rod than in a U-shaped channel element. A third advantage is in reducing the number of elements involved. Fewer longitudinal support elements are needed, as opposed to a transverse receiving and holding element required for each board or panel.

An obvious disadvantage, which actually may not be a disadvantage, in using one or more rods 260 is that each board or panel is supported over only a relatively small portion of its length (or width), as opposed to full length (or width) support when using a U-shaped element.

Rather than using a rod 260, a bottom support bracket 270 is shown in FIG. 6B. FIG. 6B is a view in partial section through an alternate embodiment of the bottom support element 260 of FIG. 6A.

The bottom support element 270 comprises an inverted V-shaped bracket 272. The two arms or legs of the bracket 272 may be appropriately secured, as by welding, to the bottom cross frame members or elements 16 and 18. A plurality of notches 274 extend into the arms or legs of the bracket from the apex or juncture of the arms or legs.

As with the rod 260, there is minimum drag-out with the support element 270. The notches 274, like the slots 262, do not provide areas in which drag-out may accumulate. Or, phrasing the matter in the opposite sense, both the rod 260 and the support element 270 encourage the liquids in which the rack apparatus 10 and the boards 2 are dipped to run off or to drain off without retaining or holding any of the liquid as dragout.

It will be apparent that, rather than use the spring 240 on top of the boards 2 as a spacer, either the rod 260 or the support element 270 may be inverted and used as a top spacer.

A second embodiment of the apparatus of the present invention is shown in FIGS. 7-15. The embodiment of the rack apparatus illustrated in FIGS. 7-15 still utilizes a "C" configuration in stiffening the circuit boards or wiring panels, but the boards or panels are in the "C" configuration from side to side, rather than from top to bottom. The receiving and holding elements into which the printed circuit boards are disposed are at an angular orientation to each other, with the distance between the receiving and holding elements being slightly less than the width of the printed circuit boards. Accordingly, there is an inherent horizontally extending "C" configuration induced into the boards or panels at the time that the boards or panels are placed into the rack apparatus.

The receiving and holding elements pivot slightly, and the pivoting action imposes an additional curvature in the printed circuit boards adjacent to the holding elements. The additional curvature, which is a very slight reverse "C" curvature, induces a further stiffening into the printed circuit boards or wiring panels to help maintain them in their spaced apart relationship during the processing of the boards or panels.

FIG. 7 is a perspective view of an alternate embodiment of the apparatus of the present invention. The alternate embodiment comprises a printed circuit or wiring board rack apparatus 300. The rack apparatus 300 includes an outer frame 302. The frame 302 includes a base element 304, a vertical element 306, and a vertical element 308. Both of the vertical elements extend upwardly from the ends of the base element 304.

Extending between the vertical frame elements or members 306 and 308 is a lower horizontal frame element or member 310 and an upper horizontal frame element or member 312. The elements 310 and 312 are spaced apart from each other and are generally parallel to each other and are generally parallel to the base element or member 304.

Generally parallel to the elements 304, 306, 308, etc., is a second base element 314, with a pair of vertical elements or members 316 and 318 extending upwardly from the base element 314. It will be noted that only a very small portion of the base element 314 is shown in FIG. 7.

Extending between the vertical elements 316 and 318 are a lower horizontal element 320 and an upper horizontal element 322. The elements 320 and 322 are generally parallel to each other and to the base element 314, and they are generally aligned with the horizontal elements 310 and 312.

There is a bottom cross element or member 324 extending between the base elements 304 and 314, generally adjacent to the vertical elements 306 and 316. There is a second bottom cross member 330 extending between the base elements or members 304 and 314 and adjacent to the vertical elements 308 and 318. There is also a cross member 326 extending transversely between the vertical elements 306 and 316 generally adjacent to the horizontal elements 310 and 320.

At the upper portion of the outer frame 302 there is an upper cross member 328. The cross member 328 extends between the frame elements or members 306 and 316 adjacent to the upper horizontal frame elements or members 312 and 322. Another cross frame member or element 332 extends transversely between the vertical frame members 308 and 318 adjacent to the longitudinally extending horizontal frame members 312 and 322.

Four brackets are secured to the bottom cross members 324 and 330. There is a bracket 340 which is secured to the cross member 324 adjacent to the base member 302, and a bracket 350 is secured to the cross member 324 adjacent to the base member 314. There is a bracket 344 secured to the cross member 330 adjacent to the base member 302, and a bracket 354 is secured to the cross member 330 adjacent to the base member 314.

Each of the brackets includes a horizontally extending slot, and the horizontally extending slots receive bars. The slots in the bracket 340 and the bracket 344 receive a bar 360, and the slots in the brackets 350 and 354 receive a bar 370. The bars 360 and 370 are movable relative to the frame 302 in the slots of the brackets in which they are disposed.

The bar 360 includes a vertically extending end plate 362 adjacent to and outwardly from the bracket 340, and an end plate 364 adjacent to and outwardly from the bracket 344. The bar 360 also includes a plurality of generally parallel slots 366 which extend inwardly into the bar from an outer edge of the bar.

Figure 11:
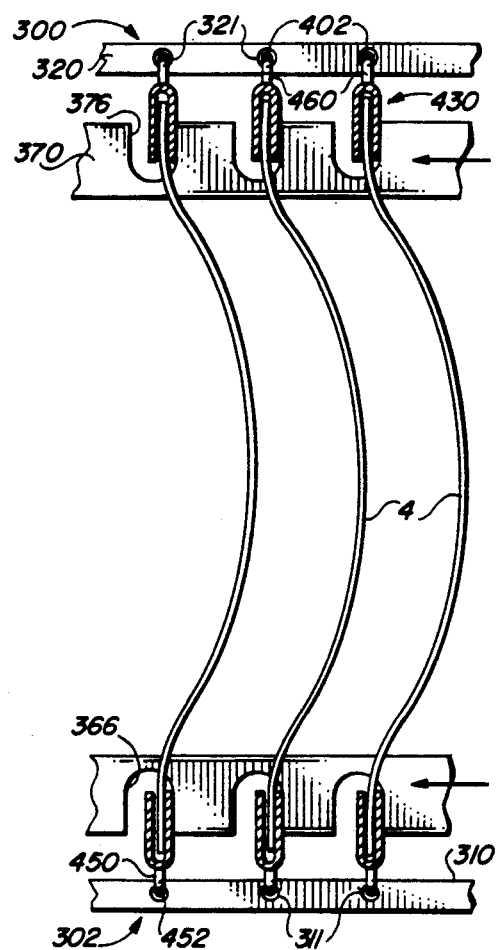
FIG. 11 is a top view illustrating sequentially the operation of the portion of the apparatus of FIG. 10.

Spaced inwardly from the end 362, and adjacent to the bracket 340, there is an aperture which receives a locking element or pin 380. Spaced apart from the aperture and the plate 372 is a lock tab. The lock tab extends upwardly on the bar 360 and cooperates with the lock element 380 to lock the bar 360 relative to the frame 302. This will be discussed in more detail in conjunction with the bar 370 as shown in FIG. 12, 13, 14, and 15. The bars 360 and 370 are substantially identical to each other, but they are mirror images of each other. This is best illustrated in FIGS. 10 and 11, and will be explained in conjunction therewith.

Figure 14:
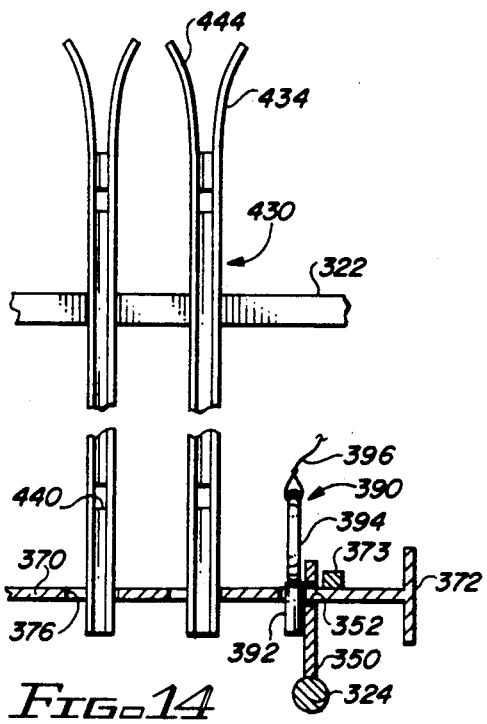
FIG. 14 is a view in partial section taken generally along line 14—14 of FIG. 12.

The bar 370 includes a vertically extending end plate 372 adjacent to the bracket 350 and an end plate 374 adjacent to the bracket 354. The bar 370 also includes an aperture 378 adjacent to the bracket 350. The aperture 378 receives a locking element or pin 390. Between the aperture 378 and the end 372, and on the opposite side of the bracket 350 from the aperture 378, as shown in FIGS. 12 and 14, is a lock tab 373. The function of the aperture 378, the lock element 390, and the tab 373 will be discussed in more detail below.

A plurality of board receiving and holding elements 400, each of which is similar to the board receiving and holding elements 60, 80, 100, 120, etc., as discussed above in conjunction with the rack apparatus 10 of FIGS. 1-5, is pivotally secured to the horizontal frame members 310 and 312. The bottom portions of each of the receiving and holding elements 400 extend into the slots 366 of the bar 360. The receiving and holding elements 400 are pivotally secured to the frame elements 310 and 312 on pins and arms, as discussed below. Unlike the receiving and holding elements of the apparatus 10, the receiving and holding elements 400 are not secured to each other, and they are not curved. Rather, the receiving and holding elements of the apparatus 300 are separate from each other and they are vertically straight.

A second plurality of board receiving and holding elements 430 is pivotally secured to the frame members 320 and 322. The bottoms of the board receiving and holding elements 430 extend into the slots 376 of the bar 370. The board receiving and holding elements 430 are substantially identical to the board receiving and holding elements 400. The elements 400 and 430 generally face each other and, as shown in FIGS. 10 and 11, the receiving and holding elements 400 and 430 are appropriately paired or aligned with each other to receive printed circuit boards or wiring panels 4.

The plurality of board receiving and holding elements 400 is pivotally secured to the horizontally extending rods 310 and 312. The plurality of board or panel receiving and holding elements 430 is likewise pivotally secured to the horizontally extending frame members 320 and 322. The board or panel receiving or holding elements 400 and 430 are substantially identical to each other. They are paired on opposite sides of the frame 302 of the rack apparatus 300.

Details of a receiving and holding element 430 are illustrated in FIGS. 8 and 9. FIG. 8 is an enlarged perspective view of the upper portion of an element 430, taken generally from circle 8 of FIG. 7. FIG. 9 is an enlarged perspective view of another portion of an element 430 taken generally from circle 9 of FIG. 7. The receiving and holding elements 400 and 430 are, as indicated above, similar also to the receiving and holding elements discussed above in conjunction with the rack apparatus 10 of FIGS. 1-5, except that the receiving and holding elements 400 and 430 are not connected together, but rather are spaced apart from each other and are independent of each other. Moreover, the receiving and holding elements of rack apparatus 10 are vertically curved, while the receiving and holding elements 400 and 430 are straight.

FIGS. 10 and 11 are the views in partial section through a portion of the rack apparatus 300. FIG. 10 illustrates the rack apparatus 300 as a plurality of circuit boards or wiring panels 4 is inserted into the holding and receiving elements 400 and 430. The "C" configuration of the panels 4 is clearly shown. FIG. 11 sequentially follows FIG. 10, and illustrates the movement of the bars 360 and 370. The movement of the bars results in the slight reverse curvature in the boards or panels adjacent to the receiving and holding elements.

For the following discussion, reference will primarily be made to FIGS. 7, 8, 9, 10, and 11.

Each element 400 includes an arm 402 and an arm 410. The arms 402 and 410 are connected together by an end 406. The end 406 terminates in a top. Extending upwardly from the arms 402 and 410, and above the top of the end 406, are guide tabs 404 and 412, respectively. The guide tabs extend slightly outwardly to help guide the boards on panels 4 into the arms 402 and 410 within the end 406.

A plurality of drain slots extend through the end 406 and into the adjacent arms 402 and 410. The drain slots are spaced apart vertically.

Extending outwardly from each end 406 of the receiving and holding elements 400 is a pivot arm 450. This is best shown in FIGS. 10 and 11. Extending downwardly from the outer end of pivot arm 450, remote from the end 406, is a pivot pin 452. The pivot pin 452 extends through an aperture 311 in the lower horizontal frame member 310.

There is similarly an upper pivot arm and pivot pin secured to the ends 406 of each element 400. The upper pivot elements include an upper pivot arm 454 and an upper pivot pin 456. The upper pivot arm and pin are best illustrated in FIG. 7. The upper pivot pins 456 extend through apertures in the horizontal frame element or member 312.

As best shown in FIGS. 8 and 9, each receiving and holding element 430 includes a pair of arms 432 and 442. The arms 432 and 442 are joined together by a curved or radiused end portion 436. The radiused end portion 436 terminates at a top 438. A plurality of drain slots 440 extends through the end 436. The arms 432 and 442 are generally parallel to each other. Extending upwardly from the top 438 of the end 436 and extending generally outwardly or away from each other, is a pair of guide tabs 434 and 444. The guide tab 434 extends upwardly and outwardly from the arm 432, and the guide tab 444 extends upwardly and outwardly from the arm 442.

Figure 15:
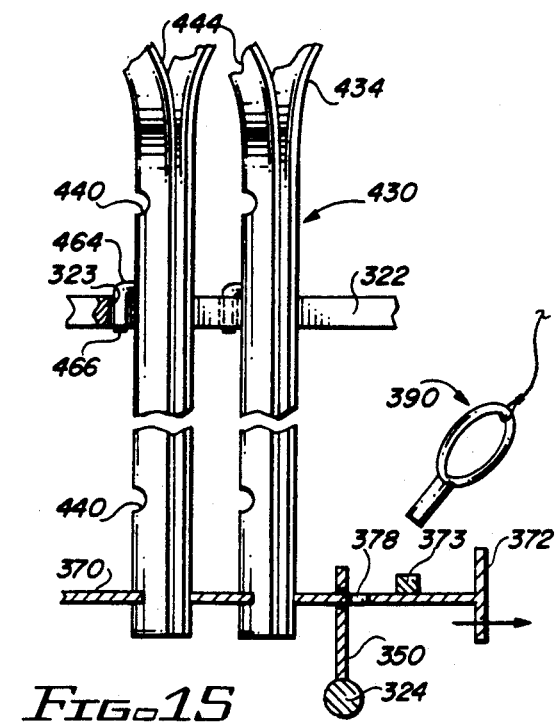
FIG. 15 is a view in partial section of the apparatus of FIG. 14 sequentially following the apparatus shown in FIG. 14.

Extending outwardly from the end 436 are two pivot arms, including a lower pivot arm 460 and an upper pivot arm 464. Extending downwardly from the outer ends of the pivot arm 460 and the pivot arm 464, and remote from the end 436, are pivot pins 462 and 466, respectively. The lower pin 462 extends into an aperture 321 in the lower frame element or member 320. The upper pivot pin 466 extends through a hole or aperture 323 in the upper frame member 322. The pivot arm 464 and the pivot pin 466 and the aperture 323 are best shown in FIG. 15.

Similarly, each board receiving and holding element 400 includes a pair of arms 402 and 410 joined together by a end 406. Guide tabs 404 and 412 extend upwardly and outwardly from the arms 402 and 410, respectively.

The lower portions of the receiving and holding elements 400 extend into the notches 366 in the bar 360. The lower ends or portions of the receiving and holding elements 430 extend into the notches 376 in the bar 370.

The bar 360, as indicated above, is movable in the horizontally extending slots in the brackets 340 and 344. Similarly, the bar 370 is movable in the horizontally extending slots in the brackets 350 and 354. As the bars 360 and 370 move horizontally, the receiving and holding elements 400 and 430 pivot on their pivot arms and pivot pins. The pivoting action of the receiving and holding elements is illustrated in FIGS. 10, 11, 12, 13, 14, and 15.

FIG. 10 is a view in partial section through a portion of the frame 302, and the bars 360 and 370 and elements 400 and 430, illustrating the use operation of the rack apparatus 300. FIG. 11 is a view in partial section of a portion of the frame 302 and the associated elements illustrating sequentially the operation of the rack apparatus 300 from that illustrated in FIG. 10. FIG. 8 is an enlarged perspective view in portion of a printed circuit board receiving and holding element 400, taken generally from circle 8 of FIG. 7. FIG. 9 is a perspective view of a portion of the frame 302 illustrating the securing of one of the board receiving and holding elements 430 to the frame member 320 and the bar 370. FIG. 9 is taken generally from circle 9 of FIG. 7.

FIGS. 12 and 13 are top views in partial section illustrating sequentially the operation of the bar 370 with respect to the receiving and holding elements 430. FIG. 12 is taken generally along line 12—12 of FIG. 7.

FIGS. 14 and 15 are front views in partial section illustrating the board receiving and holding elements 400 with respect to the bar 370. FIG. 14 and 15 correlate with FIGS. 12 and 13. That is, FIG. 14 is a front view of a portion of the apparatus illustrated in FIG. 12, taken generally along line 14—14 of FIG. 12. FIG. 15 is a front view of the apparatus illustrated in FIG. 13, taken generally along line 15—15 of FIG. 13.

For the following discussion of the operation of the rack apparatus 300, attention will be directed to all of the FIGS. 7 through 15.

In FIGS. 10 and 11, three relatively thin circuit boards or wiring panels 4 are shown disposed in and extending between three pairs of receiving and holding elements 400 and 430. The panels or boards 4 are probably thinner, and thus more flexible, than are the panels 2 illustrated and discussed above in conjunction with the rack apparatus 10. Accordingly, the stiffening technique used by the rack apparatus 300 for the boards or panels 4 is different from that illustrated and discussed in conjunction with the rack apparatus 10.

As previously mentioned, the receiving and holding elements 400 and 430 are spaced apart a distance less than the width of each board or panel 4. Accordingly, the boards, when inserted into the receiving and holding elements, conform to a general "C" configuration. The "C" configuration is from side to side, rather than from top to bottom, as with the panels 2 in the rack apparatus 10.

For inserting the panels 4 into the receiving and holding elements 400 and 430, the bars 360 and 370 are moved outwardly with respect to the frame 302. The receiving and holding elements 400 and 430 are pivoted outwardly on their pivot pins and arms, or away from a generally parallel or coplanar alignment, as the bars are moved. This is best shown in FIG. 10. With the elements 400 and 430 in their non-parallel or non-aligned or non-coplanar orientation, the boards or panels 4 are loaded into the rack apparatus 300 by inserting the panels into the receiving and holding elements. The panels 4 are actually curved to their "C" configuration prior to inserting them into the receiving and holding elements.

Due to the flexibility of the panels 4, an additional stiffening of the elements is or may be required to prevent contact between adjacent boards during the various processing and transporting steps. The additional stiffening is accomplished by moving the bars 360 and 370 inwardly so that the receiving and holding elements 400 and 430 are generally aligned with each other. This is shown in FIG. 11.

The pivoting of the receiving and holding elements toward their aligned. It will be seen in FIG. 11 that the holding and receiving elements 400 and 430 are paired, and the pairs are disposed in a generally coplanar alignment. In FIG. 10, the pairs are disposed in a non-planar alignment for receiving the panels 10. The coplanar alignment of the elements 400 and 430 of FIG. 11 imparts the double curve in the panels. Configuration induces a slight reverse curve into the boards 4 adjacent to the elements 400 and 430. The reverse curves provide the additional stiffening for the boards that allows them to maintain their spaced apart configuration or orientation during the various processing and transporting steps. The additional stiffening also helps to retain the boards or panels 4 in the elements 400 and 430 and thus in the rack apparatus 300.

In order to maintain the bars 360 and 370 in their proper orientation during their transporting and processing steps, the locking elements 380 and 390 are used. The employment of the locking elements with respect to the bars is illustrated in FIGS. 12, 13, 14, and 15. Reference will primarily be to those figures for the following discussion.

In FIGS. 12, 13, 14, and 15, the panels 4 are not shown. This is, of course, for purposes of clarity. Obviously, during the processing and transporting, the panels 4 will be disposed in the receiving and holding elements 400 and 430, as shown in FIG. 11.

As indicated above, FIGS. 12 and 14 are generally paired, and FIGS. 13 and 15 are generally paired. The bar 370 is shown in FIGS. 12 and 14 in its inward most position. In this position, the receiving and holding elements 430 are generally perpendicular to both the bar 370 and to the adjacent frame members, such as the bottom horizontal frame member 320. Accordingly, the panels 4 include the reverse curve adjacent to the receiving and holding elements 400 and 430, as shown in FIG. 11.

The lock element 390 includes a pin 392 secured to a loop 394. The lock element 390 is secured by a lanyard 396, which is preferably wire. The lanyard 396 extends from the loop 394 to a tab 398. The tab 398 is secured to the frame member 326. It will be noted, as best shown in FIGS. 12 and 14, that when the bar 370 is in its inward position, a lock tab 373 on top of the bar 370 is disposed adjacent to the bracket 350. The aperture 378 in the bar 370 is disposed on the opposite side of the bracket 350 from the lock tab 373. The pin 392 extends through the aperture 378, and accordingly the bar 370 is locked in place with respect to the bracket 350.

In FIG. 14, the bar 370 is shown extending through a slot 352 in the bracket 350. The lock element 390 is disposed on one side of the bracket 350, and the lock tab 373 is disposed on the opposite side of the bracket 350 from the lock element 390 and its aperture 378. The bar 370 is accordingly locked in place.

The bar 360, and its lock element 380, and a lock tab (not shown) on the bar 360, all function substantially the same manner as described above. In the described manner, both the bars 360 and 370 are locked in place during the various transporting and processing steps for the panels 4.

When the processing and transporting of the boards have been completed, the lock elements 380 and 390 are removed, and the bars 360 and 370 are moved outwardly. This is illustrated in FIGS. 10, 13, and 15 for the bar 370. With the lock element 390 removed from the bar 370, the bar 370 may be moved outwardly to pivot the receiving and holding elements 430 to their unaligned or non-coplanar configuration as shown in FIGS. 13 and 15 and also as shown in FIG. 10. This allows the boards or panels 4 to be removed from the rack apparatus 300 and allows new panels or boards 4 to be reinserted for processing.

It will be noted that the bars 360 and 370 provide horizontal support at the bottoms of the panels 4. In other words, the boards 4 are supported vertically on the bars 360 and 370. The outer vertical edges of the panels or boards are supported by the receiving and holding elements 400 and 430.

FIG. 16 is a perspective view of still another embodiment of the rack apparatus of the present invention, comprising expandable frame apparatus 500. The frame apparatus 500 is usable with the board or receiving apparatus of either the rack apparatus 10 or the rack apparatus 300, as desired. The frame apparatus 500 really comprises an outer frame to which receiving and holding elements may be secured.

As indicated above, there are different sized wiring panels or circuit boards in contemporary usage, and the frame apparatus 500 may be used to accommodate boards or panels of different sizes for processing. The idea with the frame apparatus 500 is that the frame, and accordingly the various panel or board receiving elements secured thereto, may be spaced apart sideways or laterally, to accommodate the boards or panels of different widths. Moreover, the frame apparatus may be adjusted vertically to also accommodate boards or panels of different heights.

For vertical accommodation, the receiving and holding elements if pivotal, such as shown in FIGS. 7-15, may also have to be telescoping. However, for fixed receiving and holding elements, telescoping elements may not be required. Rather, the receiving and holding elements may only need to be formed in two pieces or portions, upper and lower. When the frame apparatus 500 is in its lowermost configuration, the receiving and holding elements would be touching each other. As the frame expands, the receiving and holding element portions move away from each other. The two portions of the receiving and holding elements determine the curvature in the boards or panels.

The frame apparatus 500 includes a lower side base frame portion 502 and a lower side base frame portion 522. The two portions are spaced apart from each other, but they are appropriately secured together by a pair of cross connector assemblies or elements. The cross connector assemblies include a bottom front cross connector element or assembly 580 and a bottom rear cross connector assembly 590.

The lower side base frame 502 includes a lower base element 504 secured to a pair of vertical frame elements or members 506 and 508. The frame elements 506 and 508 are generally parallel to each other and are generally perpendicular to the base element 504. A longitudinally extending horizontal frame member 510 extends between and is appropriately secured to the vertical frame elements or members 506 and 508.

A front cross member 512 extends outwardly from the vertical frame member 506 and is generally perpendicular thereto. The frame element or member 512 is also generally perpendicular to both the base frame element or member 504 and the frame member or element 510. The frame element 512 is secured to the bottom front cross connector 580, as will be discussed below.

A second cross member, a rear cross member 514, is appropriately secured to the base element 504 or the vertical element 508, or to both of them adjacent to their juncture. The element 514 is generally perpendicular to both the base element 504 and the vertical element 508. The cross member 514 is secured to the bottom rear cross connector assembly 590, as will also be discussed below.

The lower side base frame 522 is substantially identical to the lower side base frame 502, and is virtually a mirror image thereof. The base frame 522 includes a base element 524 to which are secured a front vertical element or member 526 and rear vertical frame element or member 528. The elements 526 and 528 are generally parallel to the elements 506 and 508, respectively. A longitudinally extending and generally horizontal frame member 530 extends between and is appropriately secured to the vertical frame members 526 and 528. The frame element or member 530 is generally parallel to the frame member or element 510.

A front cross member 532 is secured to the vertical frame member 526 and extends outwardly generally perpendicularly thereto. The member 532 is aligned with the member 512. The frame elements or members 512 and 522 are joined by the cross connector assembly 580.

A rear cross member or element 534 is shown secured to the base frame element or member 524 and to the vertical frame element or member 528 at the juncture of the two elements. The frame element 534 is aligned with the frame member 514 of the frame portion 502. The connector 590 is used to secure the elements 534 and 514 together.

The frame apparatus 500 also includes a pair of upper side frame assemblies, including an upper side frame portion or assembly 542 and upper side frame portion 562. The upper side frame 542 includes a longitudinally extending frame member 544 which extends between a pair of vertical frame elements or members 546 and 548.

A front cross member 550 is appropriately secured to the frame member 546 at the juncture of the frame members 544 and 546. The frame cross member 550 is a front cross frame member.

There is a rear cross frame member or element 552 generally parallel to the frame member 550. The rear cross frame member 552 is secured to the vertical frame member 548 at the juncture of the frame member 548 and frame element or member 544.

The side frame assembly 562 is substantially identical to, but is a mirror image of, the upper side frame assembly 542. The upper side frame assembly 562 includes a longitudinally extending element or member 564 which is secured to a front vertical frame member 566 and to a rear vertical frame member 568. A front cross member 570 extends outwardly from the vertical frame member 566 and is generally aligned with the front cross member 550 of the upper side frame assembly 542. A rear cross member 572 is secured to the vertical frame member 568 and is generally aligned with the cross member 552 of the upper side frame assembly 542. The cross members 570 and 572 are secured to their respective vertical frame members adjacent to the longitudinally extending element 564.

The upper side frame assemblies 542 and 562 are secured together by a pair of upper cross connector assemblies 600 and 610. The cross connector assembly 600 is the upper front cross connector, and the cross connector assembly 610 is the upper rear cross connector.

The two bottom frame assemblies 502 and 522 are connected to the upper frame assemblies 542 and 562 by four vertical frame connector assemblies 620, 630, 640, and 650. The vertical frame connector assembly 620 is used to secure the vertical members 506 and 546 together. The vertical frame connector 630 is used to secure the vertical frame elements or members 508 and 548 together. The vertical frame connector 640 is used to secure together the frame elements 526 and 566, and the vertical frame connector 650 is used to secure together the vertical frame elements 528 and 568.

Details of the horizontal cross connectors and the vertical connectors are illustrated in FIGS. 17, 18, 19, and 20. FIG. 17 is a view in partial section of the vertical connector 620, used to connect the vertical frame element 506 and 546. FIG. 17 is a view in partial section taken generally along line 17—17 of FIG. 16.

The vertical connector 620 includes a sleeve 622 in which there is a bore 624. The lower portion of the bore 624 receives the upper portion of the frame element 506. The sleeve 622 is appropriately secured, as by welding, to the frame member 506.

The lower portion of the frame member 546 extends into the bore 624 of the sleeve 622. The sleeve 622 is secured to the frame member 546 by means of a thumb screw 626. The thumb screw 626 communicates with the bore 624, as is well known and understood in the art. The sleeve 622 comprises an element into which the vertical frame member or element 546 may telescope to provide the appropriate or desired vertical height for the frame apparatus 500. This is accomplished, of course, by varying the extent to which the frame member 546 extends into the bore 624 of the sleeve 622.

The vertical connector elements 620, 630, 640, and 650 are all substantially identical. Each of them is preferably secured as by welding, to the upper portion of the vertical frame members of the respective lower frame assemblies. The lower portions of the vertical frame members 546, 548, 566, and 568 of the upper frame assemblies 542 and 562 are then disposed within the upper portions of the respective sleeves as desired for the appropriate height determination of the frame 500.

The connector 630 includes a sleeve 632. The sleeve 632 is appropriately secured, as by welding, to the vertical frame member 548. The sleeve 632 includes a bore which receives both the upper portion of the vertical frame member 508, to which it is secured, and the lower portion of the frame member 548. A thumb screw 636 is used to secure the sleeve 632 to the vertical frame member 548.

The connector 640 includes a sleeve 642, an interior bore, and a thumb screw 646. Likewise, the connector 650 includes a sleeve 652, an interior bore, and a thumb screw 656. The operation of all four of the vertical connectors is substantially identical to that illustrated in FIG. 17 and as discussed above.

The horizontal frame cross connectors 580, 590, 600, and 610 are likewise generally identical in construction and function to the vertical connector assemblies discussed above. FIG. 18 is a view in partial section taken generally along line 18—18 of FIG. 16, illustrating the cross connector 580. The cross connector 580 comprises a sleeve 582 in which there is a bore 584. The bore 584 receives an outer portion of the horizontally extending cross frame member 532 to which the sleeve 582 is appropriately secured, as by welding. The sleeve 582 is thus permanently secured to the frame member or element 582. The opposite of the end of the bore 584 of the sleeve 582 receives the cross frame element or member 512. A thumb screw 586 is used to secure the sleeve 582 to the frame member 512. The cross frame connectors 580, 590, 600, and 610 are all substantially identical in structure and operation.

As best shown in FIG. 19, which comprises a view in partial section through the upper cross connector assembly 600, the cross frame members may be square in configuration, if desired. Accordingly, the cross frame connector 600 is illustrated as including sleeve 602 which has a square cross section. The square sleeve includes a square bore 604. The frame elements 550 and 570 are square elements which extend into the bore 604 of the sleeve 602. A thumb screw 606 is used to secure the frame member 550 in the bore 604. The sleeve 602 will be appropriately secured, as by welding, to the frame member 570.

The other various frame members may also be square or round, as desired. In FIG. 20, which comprises a view in partial section through the vertical frame connector 620, the vertical frame member 546 is shown as round. The various elements of the frame connector 620 are similarly round. That is, the sleeve 622 is round, as is the bore 624. Obviously, the frame elements may all be round or circular, may all be square or rectangular, or may be mixed, as indicated or as illustrated in conjunction with FIGS. 19 and 20.

FIG. 21 is a view in partial section of other frame elements and connectors which may also be used to vary the size of the outer frames of a rack apparatus. A pair of aligned vertical frame members 670 and 674 is shown, and a pair of cross frame members 672 and 676 is shown extending outwardly from the frame elements or members 670 and 674, respectively.

A similar pair of vertically aligned frame members 680 and 684 is shown spaced apart from the frame member 670 and 674. A pair of cross frame members 682 and 686 is shown extending outwardly from the frame elements or members 680 and 684, respectively. The frame members 672 and 682 are appropriately aligned with each other, as are the frame members 676 and 686.

Vertical connector assemblies are not shown interconnecting the vertical frame members 670 and 674 and the vertical frame members 680 and 684. However, it will be understood that any appropriate connectors or connector assemblies may be used, such as illustrated in conjunction with apparatus 500, or otherwise.

For convenience, two different types of sleeves are illustrated in FIG. 21 for connecting the frame members 672 and 682 and the frame member 676 and 686.

A sleeve 690 is shown connecting the frame elements 672 and 682. The sleeve 690 includes a bore 692 into which extends the frame members 672 and 682. Any appropriate means may be used to secure the frame members 672 and 682 in the sleeve 690, such as a pair of thumb screw elements 694 and 696.

It will be noted that the sleeve 690 is not secured permanently to either of the frame members 672 or 682. Rather, the sleeve 690 may be separately secured to each of the frame members 672 and 682.

A different type of connector element is used to secure the frame members or elements 676 and 686 together. The outer end of the frame element 676 includes external threads 678. Similarly, the outer end of the frame element 686 includes a threaded portion 688. A turnbuckle 700, which includes an internally threaded bore 702, is used to secure together the frame members 676 and 686. The turnbuckle 700 will, of course, include opposite threads in the bore 702 so as to be able to rotate in one direction to threadedly engage both the threaded portions 678 and 688, and be rotated in the opposite direction to disengage the threaded portions of the members 676 and 686. The turnbuckle threaded engagements are well known and understood in the art.

By means of the various connector elements illustrated in conjunction with FIGS. 17-21, it is obvious that the outer frame apparatus 500 may be expanded both vertically and horizontally to accommodate various sized panels or boards for processing. Similarly, the rack apparatus 500 may be contracted for use with smaller boards or panels, as desired. The ability to expand or contract a rack apparatus is highly desirable in that a single rack may be used for processing and transporting several different sizes of boards or panels.

Another alternate embodiment of the apparatus of the present invention, or an alternate embodiment of a portion of the apparatus of the present invention, is illustrated in FIGS. 22, 23, and 24. FIG. 22 is a perspective view of an alternate embodiment comprising a receiving and holding element 800. FIG. 23 is a front view of the holding and receiving element 800, and FIG. 24 is a side view of a portion of the receiving and holding element 800. For the following discussion, reference will primarily be made to FIGS. 22, 23, and 24.

The holding and receiving element 800 includes a pair of arms 802 and 812 connected together by an end 806. The end 806 terminates at a top 808. Extending upwardly above the top 808 of the end 806 are guide tabs 804 and 814, on the arms 801 and 812, respectively. A plurality of drain slots 810 extends through the end 806 and into the adjacent portions of the arms 802 and 812.

As best shown in FIG. 23, the arms 802 and 812, and the end 806, are not straight, as are the arms and hands of the receiving and holding elements discussed above in conjunction with FIGS. 1-15. Rather, the arms 802 and 812 and the end 806 are sinuous, with the arms generally parallel to each other, but curving vertically or along their vertical or longitudinal axes.

The purpose of the curving or sinuous configuration of the holding and receiving element 800 is to better hold onto the printed circuit boards or wiring panels that are inserted into them. That is, by having the boards or panels extend in a multi-curved orientation or multi-curved manner, additional stiffening and friction is imposed on the boards to help resist movement outwardly or away from the receiving or holding elements. This is particularly true in the case of relative thin boards or panels. With relatively thin boards or panels, even the reverse curvature of the boards or panels, as illustrated in conjunction with the rack apparatus 300 of FIGS. 7-15, may not be sufficient to resist movement, as when the rack apparatus with the boards and panels are moved downwardly through a liquid medium and moved vertically through the liquid medium.

Moreover, additional stress may be placed on the boards during a drying operation if a fan or other artificially induced air current moves over the boards. In such cases, the vertically sinuous or multi-curved configuration of the receiving and holding elements 800, and the resulting sinuous or multi-curved configuration of the panels is generally sufficient to hold the boards or panels in the holding and receiving elements and to maintain them therein regardless of the forces imposed on the boards or panels by relative movement in liquids or by the movement of drying air flows.

FIG. 25 is a top view in partial section of receiving and holding elements 830, which are substantially identical to the receiving and holding elements 800, in that they are vertically curved in a sinuous or multi-curved configuration. The receiving and holding elements 830 are secured to a side support rod 850, as by welding. The elements 830 are generally parallel to each other, but they are not perpendicular to the rod 850. Rather, they are set at an angle thereto, and permanent affixed in that position, in a general orientation as illustrated best in FIG. 10, with the pairs arranged in a non-coplanar alignment. On the hand, the receiving and holding elements 830 may be pivotally secured to the side rod 850 for pivotal movement, if desired.

Regardless of the manner of affixing the receiving and holding elements 830 to the rod 850, in addition to the vertically sinuous or multi-curved vertical orientation of a plurality of printed circuit boards or wiring panel 6 in the receiving and holding elements 830, there is also a side to side "C" configuration imposed on the boards or panels 6. The boards or panels 6 accordingly are held in not only by the stiffening induced into them by the "C" curvature, but also by the additional friction on their outer vertical edges by the multi-curved configuration of the holding and receiving elements 830.

A rod 860 is disposed beneath the panel 6 to provide vertical support for the panel 6 between their outer side edges. Obviously, there may be more than one such rod or bottom frame support.

FIG. 26 is a top view of an alternate arrangement of vertically extending and multi-curved receiving and holding elements. A plurality of vertically extending receiving and holding elements 840, which are identical to the elements 800 in that they are vertically multi-curved, is secured to horizontally extending frame member 870. The elements 840 may be secured, as by welding, to the member 870. A plurality of printed circuit boards or wiring panels 8 is shown secured to the receiving and holding elements 840. The receiving and holding elements 840 are generally parallel to each other and are generally perpendicular to the side rod 870. The holding and receiving pairs are accordingly aligned in a coplanar arrangement. The boards or panels 8 accordingly extend generally straight, rather than having a "C" curvature imposed on them, as is shown in FIG. 25.

A longitudinally extending rod 880 is shown disposed beneath the boards or panels 8. Again, one or more rods 880 may be used to support the panels vertically, as desired.

The support rods 860 and 880 may be as shown in FIGS. 6A or e6B, as desired, or any other appropriate configuration.

While the principles of the invention have been made clear in illustrative embodiments, there will be immediately obvious to those skilled in the art many modifications of structure, arrangement, proportions, the elements, materials, and components used in the practice of the invention, and otherwise, which are particularly adapted to specific environments and operative requirements without departing from those principles. The appended claims are intended to cover and embrace any and all such modifications, within the limits only of the true spirit and scope of the invention.

What I claim is:

1. Rack apparatus for wiring panels, comprising, in combination:

frame means;

panel receiving and holding means, including a first plurality and a second plurality of panel receiving and holding elements, secured to the frame means, each panel receiving and holding element including an elongate channel comprising
      a first arm having a longitudinal axis,
      a second arm having a longitudinal axis spaced apart from the first arm, and
      a bottom secured to and connecting the first and second arms; and the first and second pluralities of panel receiving and holding elements are curved along their longitudinal axes and are disposed oppositely to each other and are paired to receive and hold and to stiffen a wiring panel by curving the panel each one of said first plurality of receiving and holding elements being parallel with an oppositely corresponding one of said second plurality of receiving and holding elements.

2. The apparatus of claim 1 in which the holding and receiving elements are curved along their longitudinal axes in a generally "C" configuration to impart a top to bottom "C" curve in the wiring panels.

3. The apparatus of claim 1 in which the holding and receiving elements are multi-curved along their longitudinal axes to impart a multi-curved configuration in the panels.

4. The apparatus of claim 1 in which the first and second pluralities of panel receiving and holding elements are spaced apart from each other a distance less than the width of a wiring panel to he supported therein to provide a side to side curved "C" configuration in each panel.

5. The apparatus of claim 1 in which the frame means includes side horizontally extending frame elements to which the panel receiving and holding means are secured.

6. The apparatus of claim 1 in which the frame means includes
   a plurality of vertically extending frame elements,
   a plurality of horizontally extending side frame elements secured to the vertically extending frame elements and to the panel receiving and holding means,
   transversely extending frame elements; and
   bottom longitudinally extending holding and receiving element means on which the wiring panels are to he disposed.

7. The apparatus of claim 6 in which the bottom longitudinally extending holding and receiving element means is secured to the transversely extending frame elements.

8. The apparatus of claim 7 in which the bottom longitudinally extending holding and receiving element means comprises a rod notched to receive the wiring panels.

9. The apparatus of claim 7 in which the bottom longitudinally extending holding and receiving element means comprises a generally inverted U-shaped bracket having a plurality of notches spaced apart to receive the wiring panels.

10. Rack apparatus for receiving and holding wiring panels during the processing and transporting of the panels, comprising, in combination:
   at least one wiring pane;
   frame means, including
      base element means defining a base for supporting said at least one wiring panel,
      a plurality of vertical frame elements secured to the base element means,
      a plurality of longitudinally extending side frame elements secured to the vertical frame elements; and
   panel receiving and holding means, including
   means for imparting a curve in said at least one wiring panel, including
      a plurality of paired panel receiving and holding elements secured to the plurality of longitudinally extending side frame elements, each receiving and holding element having a longitudinal axis, and each receiving and holding element of a pair of holding and receiving elements is spaced apart from the other receiving and holding element of the pair for receiving and holding said at least one panel in a curved configuration for stiffening the panel.

11. The apparatus of claim 10 in which the holding and receiving elements are vertically curved along their longitudinal axes to provide a generally top to bottom "C" curve in said at least one panel panels.

12. The apparatus of claim 10 in which the holding and receiving elements are multi-curved along their longitudinal axes to impart a vertically multicurved configuration in said at least one panel panels.

13. The apparatus of claim 10 in which the holding and receiving elements are spaced apart a distance less than the width of the panels to provide a generally side to side "C" curve in the panels.

14. The apparatus of claim 10 in which the frame means includes means for expanding and contracting to accommodate panels of different sizes.

15. Rack apparatus for wiring panels, comprising, in combination:
   frame means;
   panel receiving and holding means, including a first plurality and a second plurality of panel receiving and holding elements, pivotably secured to the frame means, each panel receiving and holding element including an elongate channel comprising
      a first planar arm having a longitudinal axis,
      a second planar arm having a longitudinal axis spaced apart from the first arm, and
      a bottom secured to and connecting the first and second arms;
   the first and second pluralities of panel receiving and holding elements are disposed oppositely to each other and are paired to receive and hold a wiring panel and are at an orientation such that the first and second planar arms of one holding and receiving element are other than coplanar with the first and second planar arms of the oppositely corresponding receiving and holding elements so as to impart a curve in a wiring panel disposed in each pair of panel receiving and holding elements.

16. The apparatus of claim 15 in which the panel and receiving elements are pivotably secured to the frame means for imparting a reverse "C" configuration in the panels adjacent to the holding and receiving elements.

17. The apparatus of claim 14 in which the frame means includes movable bars for receiving the receiving and holding elements, and movement of the movable bars pivots the receiving and holding elements.

18. The apparatus of claim 15 in which the frame means further includes means for locking the movable bars for preventing the pivoting of the receiving and holding elements.

* * * * *